United States Patent

Shimazu et al.

Patent Number: 6,030,457
Date of Patent: Feb. 29, 2000

[54] SUBSTRATE PROCESSING APPARATUS

[75] Inventors: Tomohisa Shimazu; Kenji Honma, both of Sagamihara; Makoto Nakamura, Hachioji, all of Japan

[73] Assignee: Tokyo Electron Limited, Tokyo, Japan

[21] Appl. No.: 09/078,481

[22] Filed: May 14, 1998

[30] Foreign Application Priority Data

May 20, 1997 [JP] Japan ................................. 9-145941

[51] Int. Cl.[7] .................................................. C23C 16/00
[52] U.S. Cl. .......................... 118/715; 118/733; 118/729; 118/730
[58] Field of Search .................................. 118/730, 733, 118/715

[56] References Cited

U.S. PATENT DOCUMENTS

| | | | |
|---|---|---|---|
| 5,016,567 | 5/1991 | Iwabuchi et al. | 118/733 |
| 5,127,365 | 7/1992 | Koyama et al. | 118/724 |
| 5,324,540 | 6/1994 | Terada | 427/255.5 |

FOREIGN PATENT DOCUMENTS

| | | |
|---|---|---|
| 02138730 | 5/1990 | Japan . |
| 06168904 | 6/1994 | Japan . |
| 06220642 | 8/1994 | Japan . |

*Primary Examiner*—Bruce Breneman
*Assistant Examiner*—Norca L. Torres
*Attorney, Agent, or Firm*—Smith, Gambrell & Russell, LLP

[57] ABSTRACT

In a vertical substrate processing apparatus including a vertical reaction vessel having an open lower end, a lid closing the open lower end of the reaction vessel, a rotation shaft extending through the lid to rotate a wafer boat in the reaction vessel, a bore formed in a casing disposed below the lid to receive the rotation shaft is sealed hermetically by a magnetic sealing unit, the leakage of a gas emanated from magnetic fluid of the magnetic sealing unit into the reaction vessel is suppressed during a LPCVD process and, if the vertical processing apparatus is used for both a LPCVD process and an oxidation process, the corrosion of the components of a rotating mechanism by HCl gas is prevented. To achieve such functions, the bore is evacuated through an exhaust passage opening in to the bore at a position on the side of the reaction vessel with respect to the magnetic sealing unit. The deposition of reaction byproducts on rotating members can be prevented by supplying an inert gas, such as $N_2$ gas, through a gas supply passage when the bore is evacuated. When carrying out an oxidation process, a purging gas is supplied through the gas supply passage into the bore to prevent leakage of HCl gas into the bore.

4 Claims, 3 Drawing Sheets

FIG. I

SUBSTRATE PROCESSING APPARATUS

BACKGROUND OF THE INVENTION

1. Field of the Invention

The present invention relates to a processing apparatus including a reaction vessel to subject a substrate to a film forming process using a film forming gas in a vacuum therein, and a drive shaft extending through a hole formed in a wall of the reaction vessel, and a processing method to be carried out by the same processing apparatus.

2. Description of the Related Art

There are known vertical heat-treatment apparatus for heat-treating semiconductor wafers (hereinafter referred to simply as "wafers") in a batch processing system. Heat-treatment processes include a film forming processes called low-pressure CVD (hereinafter referred to as "LPCVD") processes, oxidation processes, impurity diffusion processes. Processing systems respectively for carrying out LPCVD processes, oxidation processes and impurity diffusion processes differ somewhat in construction from each other because furnaces for LPCVD processes, and those for oxidation processes and impurity diffusion processes differ from each other in process temperature, process pressure and gas supplying method. In all those systems, a wafer boat holding wafers in layers and mounted on a lid is carried usually from below into a vertical reaction vessel through an opening formed in the bottom wall of the reaction vessel, and the opening is closed by the lid supporting the wafer boat.

In some processing systems of such a type, the wafer boat is rotated about a vertical axis to subject the entire surfaces of the wafers uniformly to heat treatment, In such processing systems the wafer boat is supported on a rotation shaft extending through the lid. A mechanism for inserting the rotation shaft through the lid into the reaction vessel of a LPCVD system will be described, by way of example, with reference to FIG. 3.

Referring to FIG. 3, a reaction vessel comprises a double-wall reaction tube 10 and a manifold 11 connected to a lower part of the reaction tube 10. An opening formed at the lower end of the manifold 11 is closed by a lid 12. A rotation shaft 13 is extended through a tubular member 14 of a metal. A turntable 15 is attached to an upper end part of the rotation shaft 13, and a driven pulley 16 to be driven by a motor, not shown, is attached to a lower end part of the rotation shaft 13. A bearing unit 17 for supporting the rotation shaft 13 is contained in the tubular member 14. Also contained in the tubular member 14 is a magnetic sealing unit 18 for hermetically sealing the reaction vessel. The magnetic sealing unit 18 is disposed above the bearing unit 17.

When the interior of th(e reaction vessel is evacuated to a high vacuum on the order of $10^{-7}$ torr, particles emanated from a rotary mechanism including the rotation shaft 13 and the bearing unit 17, and vapors of a magnetic fluid leak into the evacuated reaction vessel. Circuit patterns of semiconductor devices have been progressively miniaturized and the severity of limits to the contamination of wafers has grown accordingly. Particles must be avoided on wafers since they cause deleterious effects leading to device degradation. Furthermore, if the film forming gas leaks into the rotary mechanism, the film forming gas comes into contact with cold parts and produces reaction byproducts. It is possible that such byproducts mix with the magnetic fluid to increase resistance against the rotating operation of the rotary mechanism.

The inventors of the present invention have made studies to provide a reaction vessel capable of being used for CVD, oxidation and diffusion through the enhancement of the corrosion resistance of the manifold 11. If a reaction vessel is used for wet oxidation, moisture will leak into the rotary mechanism, and the moisture will be diffused into the reaction vessel when the reaction vessel is used for forming an insulating film by LPCVD and will deteriorate the insulating capability of the insulating film. If hydrogen chloride gas leaks into the rotary mechanism during an oxidation process, the metal components of the rotary mechanism will be corroded, the magnetic fluid of the magnetic seal will be deteriorated and the sealing function of the magnetic seal will be deteriorated. Particularly, in a state where moisture condenses on the components of the rotary mechanism, the components of the rotary mechanism are subject to rapid corrosion and deterioration.

SUMMARY OF THE INVENTION

The present invention has been made in view of such problems and it is therefore an object of the present invention to provide a substrate processing apparatus having a sealing unit for creating a nonleaking union between a reaction vessel in which a vacuum film forming process is carried out and a shaft inserted in the reaction vessel, capable of suppressing leakage of gases therethrough and the diffusion of particles emanated from metal parts into the reaction vessel.

Another object of the present invention is to provide a processing apparatus capable of being used for both a vacuum film forming process and a process to be carried out in an atmospheric atmosphere using a corrosive gas, of avoiding the leakage of gases through a union between a reaction vessel and a drive shaft into the reaction vessel and of suppressing corrosion of the components of a sealing unit creating a nonleaking union between the reaction vessel and the drive shaft, and deterioration of sealing members.

With the foregoing object in view, the present invention provides a substrate processing apparatus comprising a reaction vessel in which a substrate is processed by using a processing gas, substrate support means for supporting the substrate in the reaction vessel, a drive shaft extending from the substrate support means downward through a bottom lid closing a bottom opening of the reaction vessel, a bearing unit disposed below the reaction vessel to support the drive shaft, a casing disposed below the reaction vessel and having a bore for receiving the drive shaft, sealing means disposed on the side of the reaction vessel relative to the bearing unit to create a nonleaking union between the bore of the casing and the drive shaft, an exhaust passage connected to the bore of the casing at a position on a side of the reaction vessel relative to the sealing means, and evacuating means connected to the exhaust passage to evacuate the bore formed in the casing through the exhaust passage.

The substrate processing apparatus may further comprise gas supply means connected to the bore of the casing at a position on the side of the reaction vessel relative to the sealing means to supply a gas into the bore of the casing.

The present invention further provides a method of operating a substrate processing system comprising a reaction vessel in which a substrate is processed by using a processing gas, substrate support means for supporting the substrate in the reaction vessel, a drive shaft extending from the substrate support means downward through a bottom lid closing a bottom opening of the reaction vessel, a casing disposed below the reaction vessel and having a bore for receiving the drive shaft, a bearing unit disposed in the casing to support the drive shaft, and sealing means disposed in the casing on the side of the reaction vessel relative to the bearing unit to create a nonleaking union between the bore of the casing and the drive shaft, the method comprising a step of evacuating the bore of the casing through a position on the side of the reaction vessel relative to the sealing means.

The above and other objects, features and advantages of the present invention will become more apparent from the following description taken in connection with the accompanying drawings.

DESCRIPTION OF THE PREFERRED EMBODIMENTS

Figure 1:
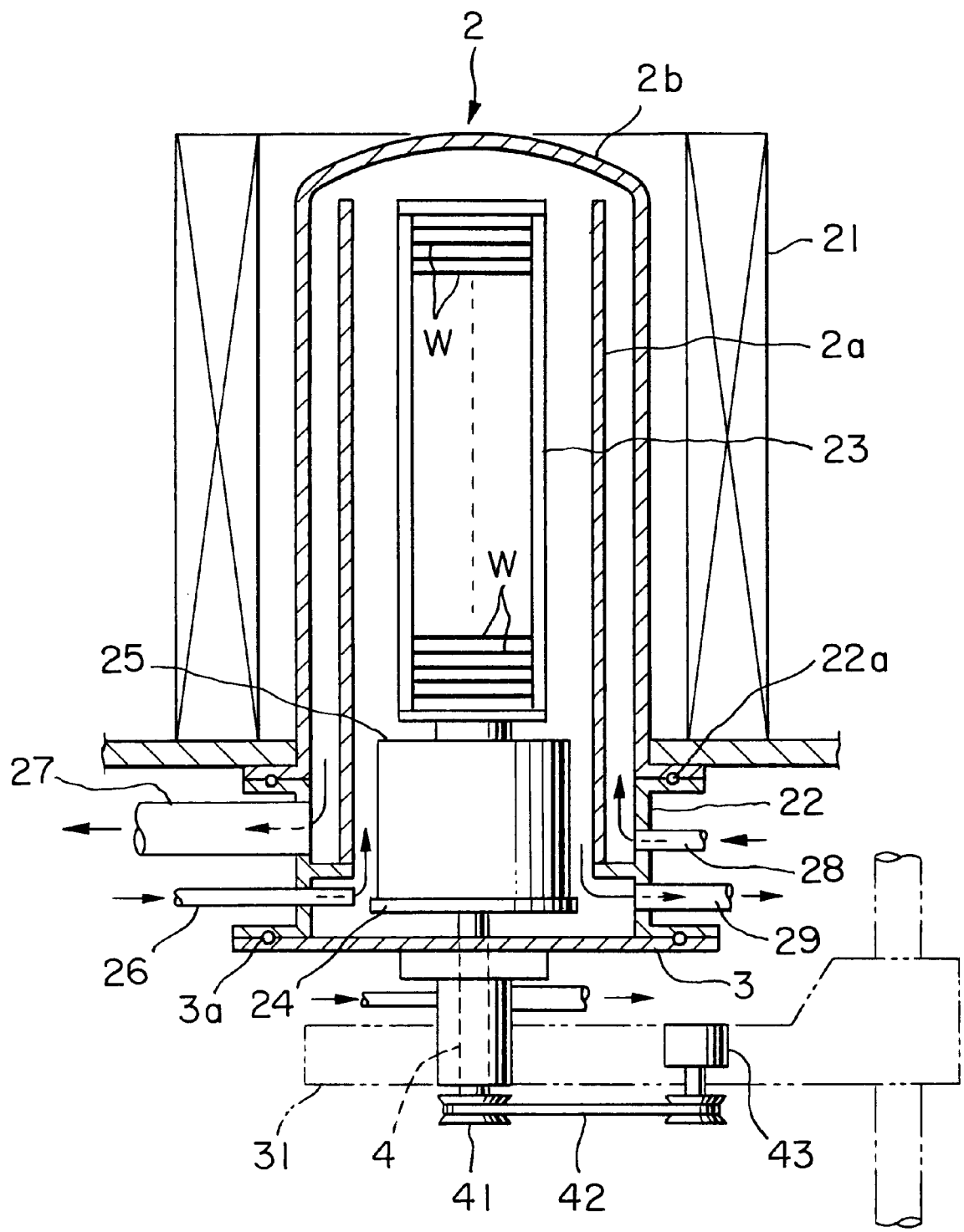
FIG. 1 is a schematic sectional view of a vertical heat-treatment apparatus in a preferred embodiment according to the present invention.

Referring to FIG. 1 showing a vertical heat-treatment apparatus in a preferred embodiment according to the present invention, a double-wall reaction tube 2 has an inner tube 2a and an outer tube 2b both made of quartz. A heater 21 is disposed so as to surround the reaction tube 2. A tubular manifold 22 of a metal is joined hermetically to the lower end of the reaction tube 2, and an O-ring 22a is compressed for hermetic sealing between the lower end of the reaction tube 2 and the tubular manifold 22. A wafer boat 23 holding a plurality of wafers W supported on vertically arranged shelves is carried through an opening formed at the lower end of the manifold 22 into the reaction tube 2, and the opening of the manifold 22 is closed by a lid 3. An O-ring 3a is compressed for hermetic sealing between the lid 3 arid the lower end of the manifold 22.

The lid 3 is mounted on a boat elevator 31, i.e., a lifting mechanism, and a rotation shaft 4 penetrates a central part of the lid 3 vertically. A pulley 41 attached to a lower end part of the rotating shaft 4 is driven for rotation through a belt 42 by a motor 43. A turntable 24 is attached to an upper end part of the rotation shaft 4. The wafer boat 23 is supported on a heat-insulating cylinder 25 mounted on the turntable 24.

The vertical heat-treatment apparatus in this embodiment is designed for use for a LPCVD process, an oxidation process and a diffusion process. Therefore, the manifold 22 has a special corrosion-resistant construction, and a first gas supply pipe 26 and a first exhaust pipe 27 to be used for LPCVD, and a second gas supply pipe 28 and a second exhaust pipe 29 to be used for oxidation and diffusion are connected to the manifold 22. In this embodiment, the reaction tube 2 and the manifold 22 constitute a reaction vessel.

Figure 2:
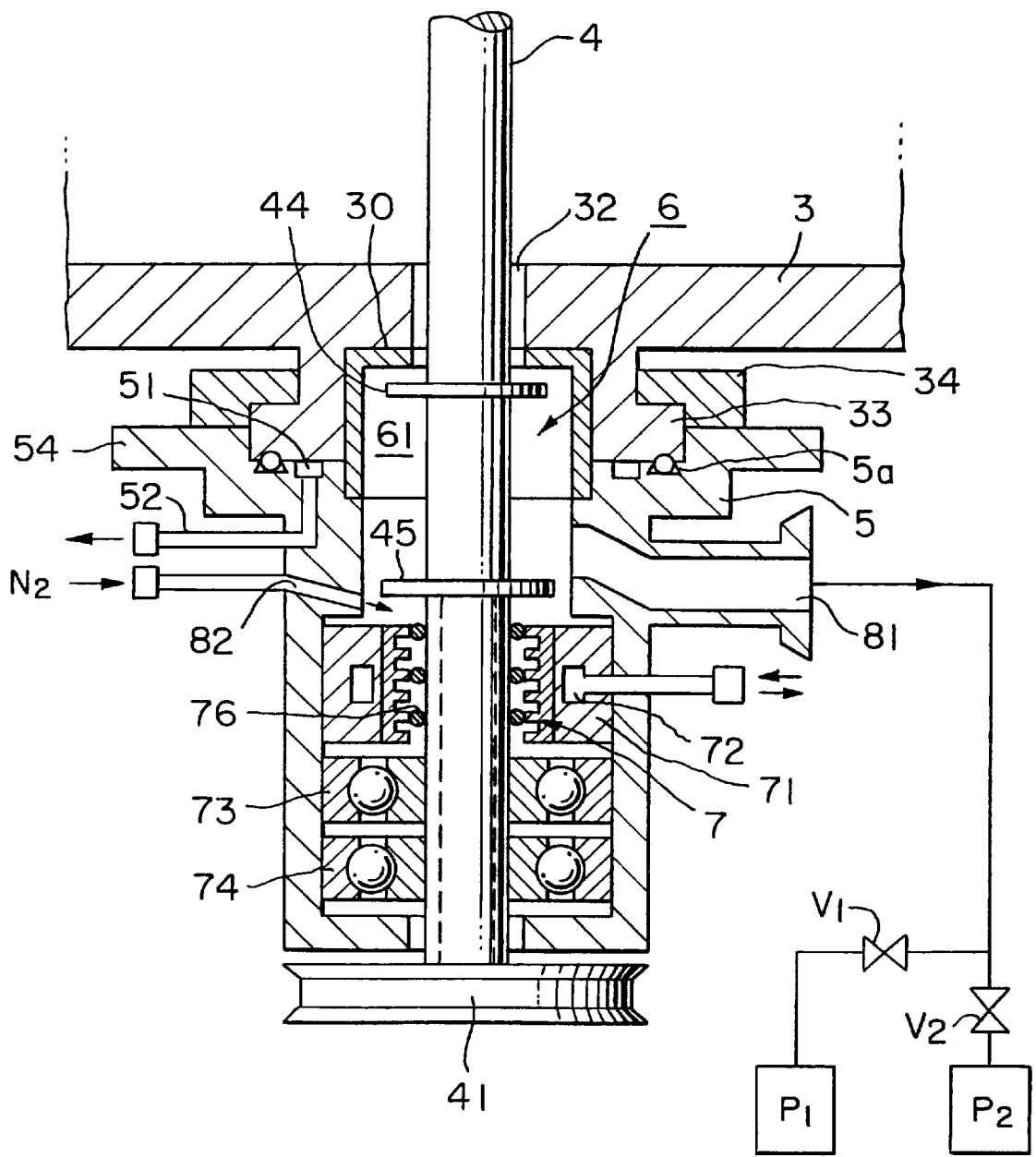
FIG. 2 is a schematic longitudinal sectional view of a rotation shaft and the associated parts included in the vertical heat-treatment apparatus of FIG. 1.
Figure 3:
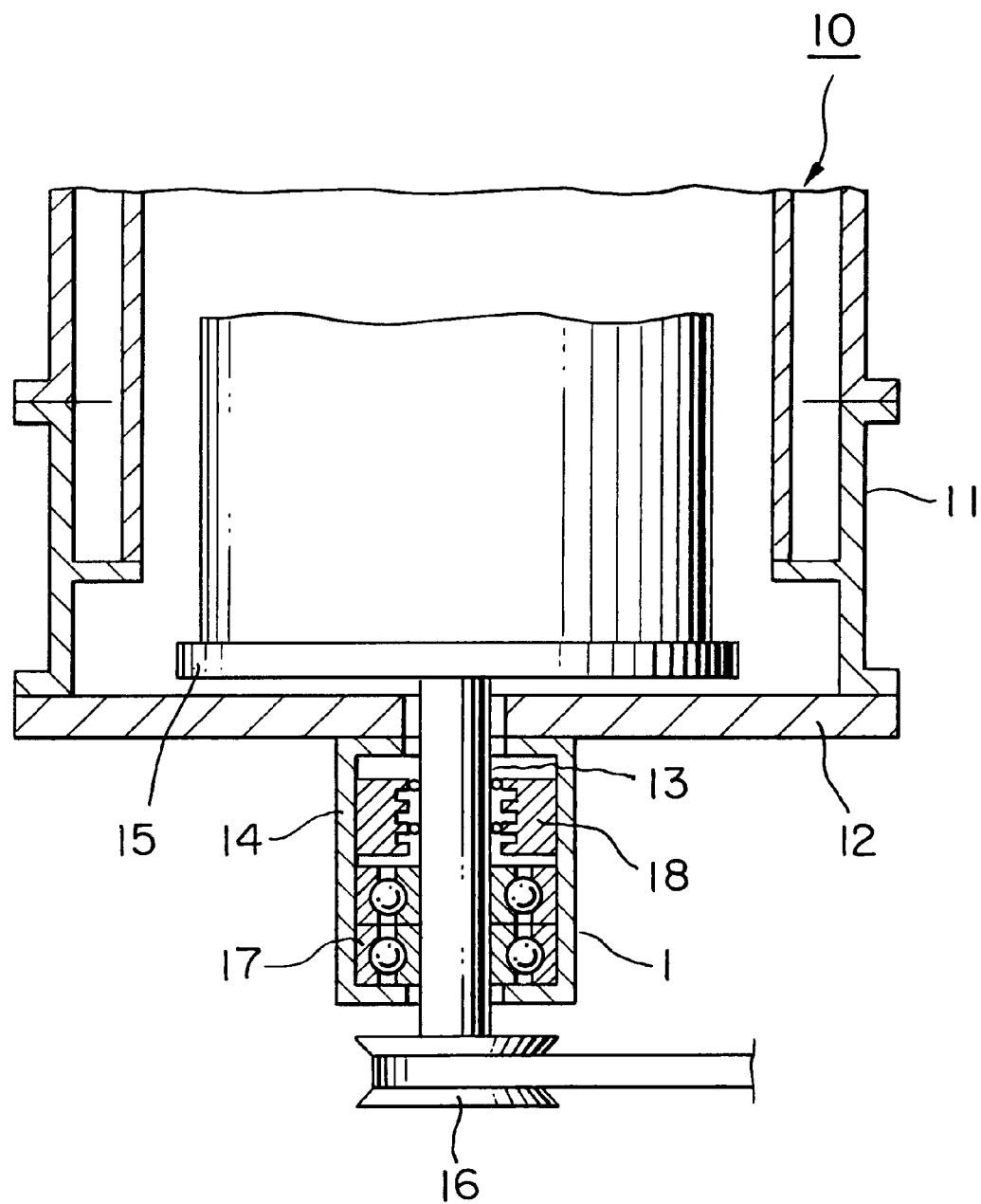
FIG. 3 is schematic longitudinal sectional view of a rotation shaft and the associated parts included in a conventional vertical heat-treatment system.

The rotation shaft and the associated parts will be described with reference to FIG. 2.

The lid 3 is provided with a central hole 32, and an annular boss is formed integrally on the lower surface thereof so as to surround the hole 32. An annular flange 33 is formed around the lower end of the annular boss. A substantially tubular casing 5 of, for example, a stainless steel is joined to the lower surface of the flange 33 with an O-ring 5a compressed therebetween. A tubular member 30 of, for example, a stainless steel is fitted in a bore defined by the annular boss and the flange 33. A circular evacuating groove 51 is formed in a surface of the casing 5 contiguous with the lower surface of the flange 33. The evacuating groove 51 is evacuated through an evacuating passage 52 to prevent gases emanating from the O-ring 5a from leaking into a processing atmosphere.

A ring 34 is disposed on the flange 33. A flange 54 formed at the upper end of the casing 5, and the ring 34 are fastened together with bolts, not shown, or the like to fasten the casing 5 to the flange 33. Parts of the joining surfaces of the casing 5 and the flange 33 extending on the radially inner side of the exhaust groove 51 are mirror-finished to provide a highly hermetic joint.

The hole 32 of the lid 3, the interior space of the tubular member 30, and the interior space of the casing 5 form a bore 6 through which the rotation shaft 4 is extended. An upper section of the bore 6 serves as a differential exhaust chamber 61. The rotation shaft 4 is provided with annular flanges 44 and 45 at positions near an upper section and a lower section, respectively, of the differential exhaust chamber 61.

A magnetic sealing unit 7 is disposed below the differential exhaust chamber 61 in the bore 6. The magnetic sealing unit 7 has a plurality of magnetic path forming rings each provided in its inner circumference with a groove of a U-shaped cross section and stacked in a vertical arrangement as is known in the art. A magnetic fluid 76 is confined in a space between each of the magnetic path forming rings and the rotation shaft 4 to create a hermetic union between a section on the side of the reaction vessel and a section on the side of the exterior of the reaction vessel. A support member 71 supporting the magnetic path forming rings of the magnetic sealing unit 7 is internally provided with a cooling water passage 72. Cooling water is circulated through the cooling water passage 72 of the support member 71 to suppress the temperature increase of the magnetic fluid. Bearings 73 and 74 are disposed in a lower section of the bore 6 below the magnetic sealing unit 7.

An exhaust passage 81 is formed in the casing 5 so as to open into a lower section of the differential exhaust chamber 61 at a position on a level above the lower flange 45. The exhaust passage 81 is connected by an exhaust line provided with a valve V1 to a vacuum pump P1. The vacuum pump P1 may be used also for evacuating the reaction vessel to a vacuum. A branch line branched from the exhaust line connected to the exhaust passage 81 is connected to an exhaust pump P2. A gas supply passage 82 is formed in the casing 5 so as to open into a lower section of the differential exhaust chamber 61 at a position on a level below the flange 45. The gas supply passage 82 is connected to an inert gas source, not shown, such as a N2 gas source.

In this embodiment, the differential exhaust chamber 61 is formed in a relatively great vertical length to suppress the temperature rise of the magnetic sealing unit 7. For example, the distance between the upper end of the magnetic sealing unit 7 and the lower surface of the lid 3 is about 70 mm. The magnetic sealing unit 7 is thus spaced from the reaction vessel and a hollow shaft is used as the rotation shaft 4 to make the heat of the reaction vessel hard to be transferred to the magnetic sealing unit 7.

The operation of the processing system in this embodiment will be described hereafter. The boat elevator 31 raises the turntable 24 supporting the wafer boat 23 holding the plurality of wafers W, i.e., substrates, supported on vertically arranged shelves to load the wafer boat 23 into the reaction vessel through the opening formed at the lower end of the reaction vessel, i.e., the opening formed at the lower end of the manifold 22, and to close the opening hermetically with the lid 3. When a LPCVD process is to be carried out, reaction gases are supplied through the first gas supply pipes 26 into the inner tube 2a while the reaction tube 2 is evacuated through an annular space between the inner tube 2a and the outer tube 2b, and the exhaust pipe 27 to create, for example, a vacuum on the order of $10^{-7}$ torr in the reaction vessel, and the reaction vessel is heated at a predetermined heat treatment temperature by the heater 21.

The rotation shaft 4 connected to the turntable 24 supporting the wafer boat 23 is driven for rotation by the motor 43, the valve V1 is opened and the valve V2 is closed to evacuate the bore 6 through which the rotation shaft 4 is extended down to a vacuum, for example, on the order of $10^{-7}$ torr through the exhaust passage 81, and to supply an inert gas, such as N2 gas, through the gas supply passage 82 into the bore 6. When the bore 6 is evacuated to a high vacuum, a gas emanates from the magnetic fluid 76 of the magnetic sealing unit 7 and particles emanate from walls defining the bore 6, The gas and the particles are discharged through the exhaust passage 81.

If the film forming gases leak through the gap between the hole 32 of the lid 3 and the rotation shaft 4 into the bore 6 and come into contact with the relatively cold walls defining the bore 6, the rotation shaft 4 and the components of the magnetic sealing unit 7, byproducts are produced. However, the byproducts are blown away by N2 gas blown into the bore 6. Since N2 gas is blown particularly into the space between the magnetic sealing unit 7 and the lower flange 45 of the rotation shaft 4, the attachment and mixing of the byproducts with the magnetic fluid 76 can be prevented and hence resistance against the rotation of the rotation shaft 4 will not increase.

A LPCVD process for forming a polysilicon film uses SiH4 gas, and a LPCVD process for forming a silicon nitride ($Si_3N_4$) film uses $SiH_2Cl_2$ gas and $NH_3$ gas. The latter LPCVD process produces a large amount of ammonium chloride as a byproduct. Therefore blowing N2 gas into the space between the magnetic sealing unit 7 and the lower flange 45 of the rotation shaft 4 is effective in preventing the mixing of ammonium chloride with the magnetic fluid 76 in the latter LPCVD process. According to the present invention, the bore 6 may be merely evacuated and the inert gas need not necessarily be blown into the bore 6.

An oxidation operation of the processing apparatus for oxidizing wafers will be described hereafter. A corrosive gas, such as HCl gas, and $O_2$ gas are supplied through the second gas supply pipe 28 into the annular space between the inner tube 2a and the outer tube 2b, while the reaction vessel is evacuated through the exhaust pipe 29 to maintain the interior of the reaction vessel at the atmospheric pressure. The interior of the reaction vessel is heated at, for example, 1000° C. by the heater 21 to form a $SiO_2$ film by oxidizing a polysilicon film or a silicon nitride film formed on surfaces of the wafers W.

The bore 6 is purged bar supplying N2 gas, i.e., a purging gas, through the gas supply passage 82 into the bore 6 at 0.02 l/min. The purging gas suppresses the flow of the reaction gasses from the reaction vessel into the bore 6, so that the corrosion of the wall defining the bore 6 and the deterioration of the magnetic fluid by HCl gas can be avoided. Since the condensation of moisture in the bore 6 can be prevented, the leakage of moisture from the bore 6 into the hot processing atmosphere during a LPCVD process can be avoided.

Although the valves V1 and V2 may be kept closed and the bore 6 need not necessarily be evacuated during the oxidation process, the valve V2 may be opened and the bore 6 may be moderately evacuated by the pump P2 to prevent the leakage of the purging gas into the reaction vessel. The purging gas need not be limited to an inert gas; $O_2$ gas may be used as a purging gas when $O_3$ gas (ozone gas) is used for oxidation. Since $O_2$ gas and $O_3$ gas are analogous in chemical properties, there will not be adverse influence on the oxidation process even if $O_2$ gas leaks into the reaction vessel.

The supply of the purging gas into the bore 6 is effective when the interior of the reaction vessel is cleaned by HCl gas, for example, after a LPCVD process is carried out. The HCl gas is prevented from entering the bore 6.

Thus, the processing apparatus in this embodiment is capable of preventing the leakage of gases emanating from the magnetic fluid into the hot processing atmosphere during the LPCVD process. When the vertical heat-treatment apparatus is used as both a LPCVD furnace and an oxidation furnace (diffusion furnace), the leakage of HCl gas and $O_2$ gas into the bore 6 can be suppressed to prevent the deterioration of the magnetic fluid and the corrosion of the metal parts disposed in the bore 6.

As mentioned above, the present invention can be used for a LPCVD furnace employing an evacuating system for evacuating the bore 6.

As is apparent from the foregoing description, according to the present invention, in the processing apparatus having the sealing mechanism for creating a nonleaking union between the reaction vessel in which a vacuum film forming process is carried out and the drive shaft inserted in the reaction vessel, the leakage of gases emanated from the sealing unit and the diffusion of particles emanated from metal parts through the nonleaking union into the reaction vessel can be prevented. In the processing apparatus capable of being used for both a vacuum film forming process and a process to be carried out in an atmospheric atmosphere using a corrosive gas, the leakage of gases emanated from the sealing unit through the union between the reaction vessel and the drive shaft into the reaction vessel and the corrosion of the components of the sealing unit and the deterioration of the sealing members can be suppressed.

What is claimed is:

1. A substrate processing apparatus comprising:
   a reaction vessel in which a substrate is processed using a processing gas;
   substrate support means for supporting the substrate in the reaction vessel;
   a drive shaft extending from the substrate support means downward through a bottom lid closing a bottom opening of the reaction vessel;
   a casing disposed below the reaction vessel and having a bore for receiving the drive
   a bearing unit disposed below the reaction vessel and within said casing, to support the drive shaft;
   magnetic sealing means within said casing on a side of the reaction vessel relative to the bearing unit to provide a nonleaking union between the bore of the casing and the drive shaft;
   an exhaust passage connected to the bore of the casing at a position on a side of the reaction vessel relative to the magnetic sealing means;
   a plurality of annular flanges provided on said drive shaft so as to provide a labyrinth in a region of said bore on a side of the reaction vessel relative to the magnetic sealing means, said annular flanges including a first flange nearest to the magnetic sealing means; and an inert gas supply passage connected to the bore of the casing at a position between said magnetic sealing means and said first flange nearest to the magnetic sealing means, to supply an inert gas into the bore.

2. The substrate processing apparatus according to claim 1, further comprising a tubular member fitted in the bore adjacent to the reaction vessel.

3. The substrate processing apparatus according to claim 1, wherein the exhaust passage is connected to the bore at a position on a side of the reaction vessel relative to the first flange.

4. The substrate processing apparatus according to claim 1, wherein the drive shaft is provided with a second flange in a section of the bore adjacent to the reaction vessel to form the labyrinth.

* * * * *